(12) United States Patent
Murashima et al.

(10) Patent No.: US 11,905,456 B2
(45) Date of Patent: Feb. 20, 2024

(54) ANISOTROPIC GRAPHITE, ANISOTROPIC GRAPHITE COMPOSITE, AND METHOD FOR PRODUCING SAME

(71) Applicant: KANEKA CORPORATION, Osaka (JP)

(72) Inventors: Kensuke Murashima, Osaka (JP); Makoto Kutsumizu, Osaka (JP); Satoshi Oku, Osaka (JP); Katsuhiro Chikuba, Osaka (JP)

(73) Assignee: KANEKA CORPORATION, Osaka (JP)

( * ) Notice: Subject to any disclaimer, the term of this patent is extended or adjusted under 35 U.S.C. 154(b) by 638 days.

(21) Appl. No.: 17/033,004

(22) Filed: Sep. 25, 2020

(65) Prior Publication Data

US 2021/0017438 A1    Jan. 21, 2021

Related U.S. Application Data

(63) Continuation of application No. PCT/JP2019/012382, filed on Mar. 25, 2019.

(30) Foreign Application Priority Data

Mar. 28, 2018 (JP) .................... 2018-062844

(51) Int. Cl.
*C09K 5/14*     (2006.01)
*B32B 9/04*    (2006.01)
(Continued)

(52) U.S. Cl.
CPC ............... *C09K 5/14* (2013.01); *B32B 9/007* (2013.01); *B32B 9/041* (2013.01); *B32B 37/18* (2013.01);
(Continued)

(58) Field of Classification Search
CPC .......... C09K 5/14; B32B 9/041; B32B 37/18; B32B 9/007; C01B 32/205
(Continued)

(56) References Cited

U.S. PATENT DOCUMENTS

2011/0014417 A1    1/2011  Lemak et al.
2011/0316038 A1   12/2011  Hirotsuru et al.
(Continued)

FOREIGN PATENT DOCUMENTS

JP    2004311505 A    11/2004
JP    2008212982 A     9/2008
(Continued)

OTHER PUBLICATIONS

Machine_English_translation_JP_2012238733_A; Chikuba, K et al.; Anisotropic Thermally-Conductive Element and Manufacturing Method Thereof; Dec. 6, 2012; EPO; whole document (Year: 2023).*

(Continued)

*Primary Examiner* — Tahseen Khan
(74) *Attorney, Agent, or Firm* — Osha Bergman Watanabe & Burton LLP

(57) ABSTRACT

Anisotropic graphite and an anisotropic graphite composite are provided, each having excellent heat transmission performance and excellent long-term reliability as a heat transmitting element, and a production method for the anisotropic graphite composite. A face of anisotropic graphite which face is perpendicular to crystal orientation planes of graphite layers of the anisotropic graphite may be subjected to surface treatment so as to obtain anisotropic graphite having a specific surface roughness. An anisotropic graphite composite may include anisotropic graphite having an interface that has a specific interface roughness; a titanium-containing metal layer; and an inorganic material layer.

6 Claims, 3 Drawing Sheets

(51) Int. Cl.
  B32B 9/00 (2006.01)
  B32B 37/18 (2006.01)
  C01B 32/205 (2017.01)
  H05K 7/20 (2006.01)
(52) U.S. Cl.
  CPC ...... *C01B 32/205* (2017.08); *B32B 2307/706* (2013.01); *C01P 2002/78* (2013.01); *C01P 2006/32* (2013.01); *C01P 2006/90* (2013.01); *H05K 7/20509* (2013.01)
(58) Field of Classification Search
  USPC ......................................................... 428/141
  See application file for complete search history.

(56) References Cited

U.S. PATENT DOCUMENTS

| | | |
|---|---|---|
| 2013/0136895 A1 | 5/2013 | Usui et al. |
| 2014/0346710 A1 | 11/2014 | Usui et al. |
| 2014/0349067 A1 | 11/2014 | Usui et al. |

FOREIGN PATENT DOCUMENTS

| | | | |
|---|---|---|---|
| JP | 2012-23335 A | | 2/2012 |
| JP | 2012-533882 A | | 12/2012 |
| JP | 2012238733 A | * | 12/2012 |
| JP | 2012238733 A | | 12/2012 |
| JP | 5930604 B2 | | 6/2016 |
| JP | 2016-153356 A | | 8/2016 |
| TW | 201105577 A | | 2/2011 |

OTHER PUBLICATIONS

Office Action issued in corresponding Taiwanese Patent Application No. 108110868, dated Sep. 19, 2022, with translation (8 pages).
Notification of Reasons for Refusal issued in Japanese Patent Application No. 2020-510039, dated Feb. 22, 2022 (6 pages).
International Search Report issued in corresponding International Application No. PCT/JP2019/012382; dated Jun. 4, 2019 (1 page).
International Preliminary Report on Patentability issued in corresponding International Application No. PCT/JP2019/012382; dated Jun. 4, 2019 (7 pages).

* cited by examiner

ANISOTROPIC GRAPHITE, ANISOTROPIC GRAPHITE COMPOSITE, AND METHOD FOR PRODUCING SAME

TECHNICAL FIELD

One or more embodiments relates to anisotropic graphite, an anisotropic graphite composite, and a production method for the anisotropic graphite composite.

BACKGROUND

Graphite is widely used as an element for effectively transferring and dissipating heat produced in electronic equipment and devices.

Anisotropic graphite in particular has high thermal conductivity. Anisotropic graphite has graphite structures in which six-membered rings are joined by covalent bonds. The graphite structures are joined by Van der Waals forces. Anisotropic graphite reduces or prevents the occurrence of hot spots in electronic equipment or an electronic part which acts as a heat source. Anisotropic graphite is useful as a heat transmitting element which efficiently transmits heat from a heat source to a cooling apparatus.

When a heat transmitting element is used, it is necessary for the heat transmitting element to be in close contact with the heat source. Anisotropic graphite is structurally fragile and easily broken. As such, Patent Literature 1 proposes forming an inorganic material layer on the surface of anisotropic graphite, in consideration of the contact between the anisotropic graphite and a heat source. Patent Literature 1 discloses a method of forming the inorganic material layer on the anisotropic graphite, in which method a titanium-containing metal layer having a thickness of 0.05 mm to 0.10 mm is used as an insert material between the anisotropic graphite and the inorganic material layer.

[Patent Literature 1]

Japanese Patent No. 5930604

The titanium-containing metal layer has thermal conductivity which is lower than that of the anisotropic graphite. Anisotropic graphite composites having a thick titanium-containing metal layer can have poor heat transmission performance. On the other hand, anisotropic graphite composites having a thin titanium-containing metal layer can have low bond strength between the anisotropic graphite and the titanium-containing metal layer and/or low bond strength between the titanium-containing metal layer and the inorganic material layer. If the bonding strength is low, the anisotropic graphite or the inorganic material layer separates from the titanium-containing metal layer with repeated use of the electronic equipment or electronic part. As such, long-term reliability has been a problem for anisotropic graphite composites.

SUMMARY

In one or more embodiments, are provided an anisotropic graphite and an anisotropic graphite composite each of which has excellent heat transmission performance and excellent long-term reliability as a heat transmitting element, and a production method for the anisotropic graphite composite.

One or more embodiments includes:

[1]

Anisotropic graphite including:

graphite layers whose respective crystal orientation planes are parallel to an X-Z plane, given an X axis, a Y axis orthogonal to the X axis, and a Z axis perpendicular to an X-Y plane, the anisotropic graphite having a length in a direction parallel to the X axis of not less than 4 mm and not more than 300 mm, the anisotropic graphite having a length in a direction parallel to the Y axis of not less than 4 mm and not more than 300 mm, the anisotropic graphite having a thickness in a Z axis direction of not less than 0.5 mm and not more than 5.0 mm, and out of faces of the anisotropic graphite which are parallel to the X-Y plane, at least one face having a surface roughness of not less than 1 μm and not more than 15 μm.

[2]

An anisotropic graphite composite including: (a) anisotropic graphite; a (b) titanium-containing metal layer; and a (c) inorganic material layer, the (a) anisotropic graphite having graphite layers whose respective crystal orientation planes are parallel to an X-Z plane, given an X axis, a Y axis orthogonal to the X axis, and a Z axis perpendicular to an X-Y plane, the (a) anisotropic graphite having a length in a direction parallel to the X axis of not less than 4 mm and not more than 300 mm, the (a) anisotropic graphite having a length in a direction parallel to the Y axis of not less than 4 mm and not more than 300 mm, the (a) anisotropic graphite having a thickness in a Z axis direction of not less than 0.5 mm and not more than 5.0 mm, the (a) anisotropic graphite, the (b) titanium-containing metal layer, and the (c) inorganic material layer being stacked in this order in the Z axis direction and joined to each other, an interface of the (a) anisotropic graphite, at which the (a) anisotropic graphite is joined to the (b) titanium-containing metal layer, having an interface roughness of not less than 1 μm and not more than 15 μm, an interface of the (c) inorganic material layer, at which the (c) inorganic material layer is joined to the (b) titanium-containing metal layer, having an interface roughness of not less than 1 μm and not more than 15 μm.

[3]

A method of producing an anisotropic graphite composite, including:

(i) a surface treatment step of roughening or polishing the surface of at least one face of (a) anisotropic graphite, the at least one face being selected from faces of the (a) anisotropic graphite which are perpendicular to crystal orientation planes of graphite layers in the (a) anisotropic graphite, the crystal orientation planes being parallel to an X-Z plane, given an X axis, a Y axis orthogonal to the X axis, and a Z axis perpendicular to an X-Y plane; and (ii) a joining step of stacking the (a) anisotropic graphite, a (b) titanium-containing metal layer, and a (c) inorganic material layer in this order in a Z axis direction and joining the (a) anisotropic graphite, the (b) titanium-containing metal layer, and the (c) inorganic material layer to each other.

One or more embodiments may make it possible to provide anisotropic graphite and an anisotropic graphite composite each of which has excellent heat transmission performance and excellent long-term reliability as a heat transmitting element, and a production method for the anisotropic graphite composite.

DETAILED DESCRIPTION

While some embodiments are described herein, the present description is not, however, limited to these embodiments. The one or more embodiments are not limited to the configurations described below, but may be altered within the scope of the claims by a person skilled in the art. One or more embodiments also encompasse, in its technical scope, any embodiment derived by combining technical means disclosed in differing embodiments and Examples. Further, it is possible to form a new technical feature by combining the technical means disclosed in the respective embodiments. All academic and patent documents cited in the present specification are incorporated herein by reference. Any numerical range expressed as "A to B" in the present specification means "not less than A and not more than B (i.e., a range from A to B which includes both A and B)" unless otherwise stated.

According to one or more embodiments, are provided (a) anisotropic graphite, an (A) anisotropic graphite composite, and a production method for the anisotropic graphite composite in accordance with one or more embodiments.

1. (a) Anisotropic Graphite

Anisotropic graphite in accordance with one or more embodiments includes: graphite layers whose respective crystal orientation planes are parallel to an X-Z plane, given an X axis, a Y axis orthogonal to the X axis, and a Z axis perpendicular to an X-Y plane, the anisotropic graphite having a length in a direction parallel to the X axis of not less than 4 mm and not more than 300 mm, the anisotropic graphite having a length in a direction parallel to the Y axis of not less than 4 mm and not more than 300 mm, the anisotropic graphite having a thickness in a Z axis direction of not less than 0.5 mm and not more than 5.0 mm, and out of faces of the anisotropic graphite which are parallel to the X-Y plane, at least one face having a surface roughness of not less than 1 μm and not more than 15 μm.

Figure 1:
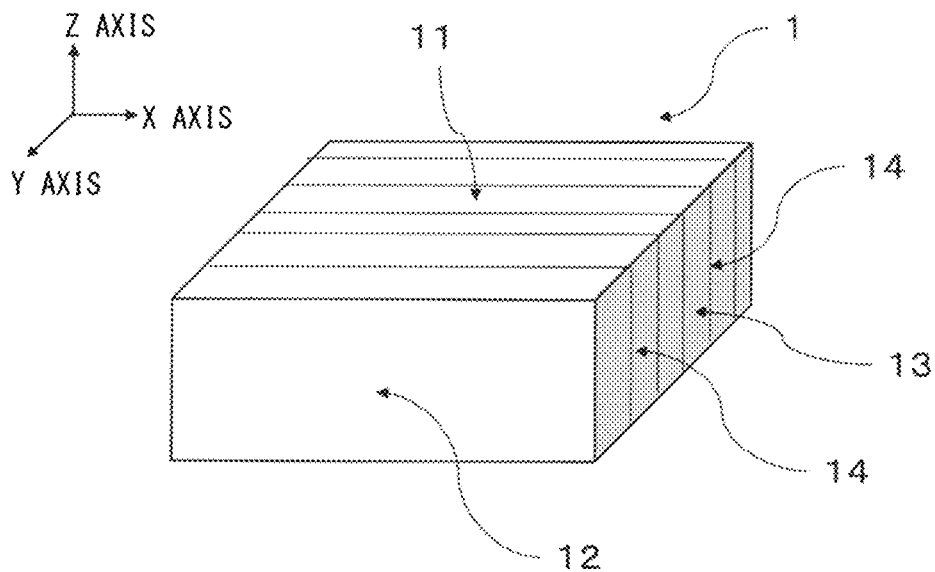
FIG. 1 is a perspective view of anisotropic graphite.

The (a) anisotropic graphite in accordance with one or more embodiments has a block-like form in which there are a plurality of stacked layers (graphite layers), each layer having a graphite structure in which six-membered rings are joined by covalent bonds. The block-like (a) anisotropic graphite has high thermal conductivity in a direction parallel to a crystal orientation plane of the graphite layers. The word "anisotropic" in "anisotropic graphite" refers to the fact that, because the graphite layers have an orientation, the thermal conductivity of the anisotropic graphite differs greatly between a direction parallel to the crystal orientation planes of the graphite layers and a direction perpendicular to the crystal orientation planes. FIG. 1 illustrates the (a) anisotropic graphite 1 arranged such that, given an X axis, a Y axis orthogonal to the X axis, and a Z axis perpendicular to an X-Y plane, the crystal orientation planes 14 of the graphite layers are parallel to an X-Z plane. For convenience, explanations in the following descriptions will use these X, Y, and Z axes.

Cross Section Perpendicular to Crystal Orientation Planes

As illustrated in FIG. 1, the (a) anisotropic graphite 1 in accordance with one or more embodiments has crystal orientation planes 14 which are parallel to the X-Z plane. Cross sections perpendicular to the crystal orientation planes 14 are: a face 11 parallel to the X-Y plane; a face opposite the face 11; a face 13 parallel to a Y-Z plane; and a face opposite the face 13. Note that the faces parallel to the crystal orientation planes 14 are: a face 12 parallel to the X-Z plane; and a face opposite the face 12.

Length of (a) Anisotropic Graphite in Direction Parallel to X Axis

The (a) anisotropic graphite in accordance with one or more embodiments has a length in a direction parallel to the X axis may be not less than 4 mm and not more than 300 mm, and may be not less than 10 mm and not more than 100 mm.

Length of (a) Anisotropic Graphite in Direction Parallel to Y axis

The (a) anisotropic graphite in accordance with one or more embodiments has a length in a direction parallel to the Y axis which may be not less than 4 mm and not more than 300 mm, and more may be not less than 10 mm and not more than 100 mm.

The length of the anisotropic graphite in the direction parallel to the X axis and the length of the anisotropic graphite in the direction parallel to the Y axis may be (i) the same, (ii) such that the former is greater than the latter, or (iii) such that the latter is greater than the former.

Thickness of (a) Anisotropic Graphite in Z Axis Direction

The (a) anisotropic graphite in accordance with one or more embodiments has a thickness in a Z axis direction which may be not less than 0.5 mm and not more than 5.0 mm, or which may be not less than 1.0 mm and not more than 3.5 mm, or which may be not less than 1.2 mm and not more than 2.5 mm.

Surface Roughness of (a) Anisotropic Graphite

In the (a) anisotropic graphite in accordance with one or more embodiments, out of faces with are perpendicular to the crystal orientation planes of the graphite layers (i.e., in FIG. 1, the face 11 and face opposite thereof, and the face 13 and the face opposite thereof), at least one face has a surface roughness of not less than 1 μm not more than 15 μm, or not less than 2 pm and not more than 10 μm, or not less than 3 μm and not more than 5 μm.

The surface roughness being not more than 15 μm facilitates the diffusion of atoms at a joining surface when a titanium-containing metal layer is used to join the anisotropic graphite to another member. The surface roughness being not more than 15 μm enables a good balance between the heat transmission performance and the long-term reliability of a resulting anisotropic graphite composite. The surface roughness being not less than 1 μm enables an increase in the specific surface area of the joining surface and therefore enables the formation of a favorable atomic diffusion layer. This results in a good balance between heat transmission performance and the long-term reliability of the resulting anisotropic graphite composite.

In the (a) anisotropic graphite in accordance with one or more embodiments, out of faces which are perpendicular to the crystal orientation planes of the graphite layers, the surface roughness of two faces (e.g., two opposite faces, the face 11 and the face opposite thereof in FIG. 1, or the face 13 and the face opposite thereof in FIG. 1) may be not less than 1 μm and not more than 15 μm, or not less than 2 μm and not more than 10 pm, or not less than 3 μm and not more than 5 μm.

The term "surface roughness" as used herein refers to a maximum height, which is the difference between the highest part of a surface and the lowest part of the surface.

Type of Anisotropic Graphite

The (a) anisotropic graphite in accordance with one or more embodiments is not limited to a particular type of anisotropic graphite, provided that it has high thermal conductivity in a planar direction of the graphite structure having six-membered rings joined by covalent bonds. Examples which can be used as the (a) anisotropic graphite include anisotropic graphite produced by polymer decomposition, pyrolytic anisotropic graphite, extrusion molded anisotropic graphite, and molded anisotropic graphite. The (a) anisotropic graphite has a high thermal conductivity of not less than 1500 W/mK in the planar direction of the graphite structure having six-membered rings joined by covalent bonds. The (a) anisotropic graphite may be polymer degradation anisotropic graphite or pyrolytic anisotropic graphite because these types of graphite enable the anisotropic graphite composite which is produced using the (a) anisotropic graphite to have excellent heat transmission performance.

Method of Producing Anisotropic Graphite

Examples of methods of producing the (a) anisotropic graphite in accordance with one or more embodiments include a method involving cutting a graphite block obtained by graphitizing a stack of films made of a polymer such as polyimide. The method of cutting can be selected as appropriate from known techniques such as diamond cutting, wire sawing, and machining. The method of cutting may be wire sawing because wire sawing makes it easy to attain a surface roughness of not more than 20 μm in the (a) anisotropic graphite. A method of surface polishing or roughing can be selected as appropriate from known techniques such as filing, buffing, and blast treatment.

2. Anisotropic Graphite Composite

An anisotropic graphite composite in accordance with one or more embodiments includes: (a) anisotropic graphite; a (b) titanium-containing metal layer; and a (c) inorganic material layer, the (a) anisotropic graphite having graphite layers whose respective crystal orientation planes are parallel to an X-Z plane, given an X axis, a Y axis orthogonal to the X axis, and a Z axis perpendicular to an X-Y plane, the (a) anisotropic graphite having a length in a direction parallel to the X axis of not less than 4 mm and not more than 300 mm, the (a) anisotropic graphite having a length in a direction parallel to the Y axis of not less than 4 mm and not more than 300 mm, the (a) anisotropic graphite having a thickness in a Z axis direction of not less than 0.5 mm and not more than 5.0 mm, the (a) anisotropic graphite, the (b) titanium-containing metal layer, and the (c) inorganic material layer being stacked in this order in the Z axis direction and joined to each other, an interface of the (a) anisotropic graphite, at which the (a) anisotropic graphite is joined to the (b) titanium-containing metal layer, having an interface roughness of not less than 1 μm and not more than 15 μm, an interface of the (c) inorganic material layer, at which the (c) inorganic material layer is joined to the (b) titanium-containing metal layer, having an interface roughness of not less than 1 μm and not more than 15 μm.

Figure 2:
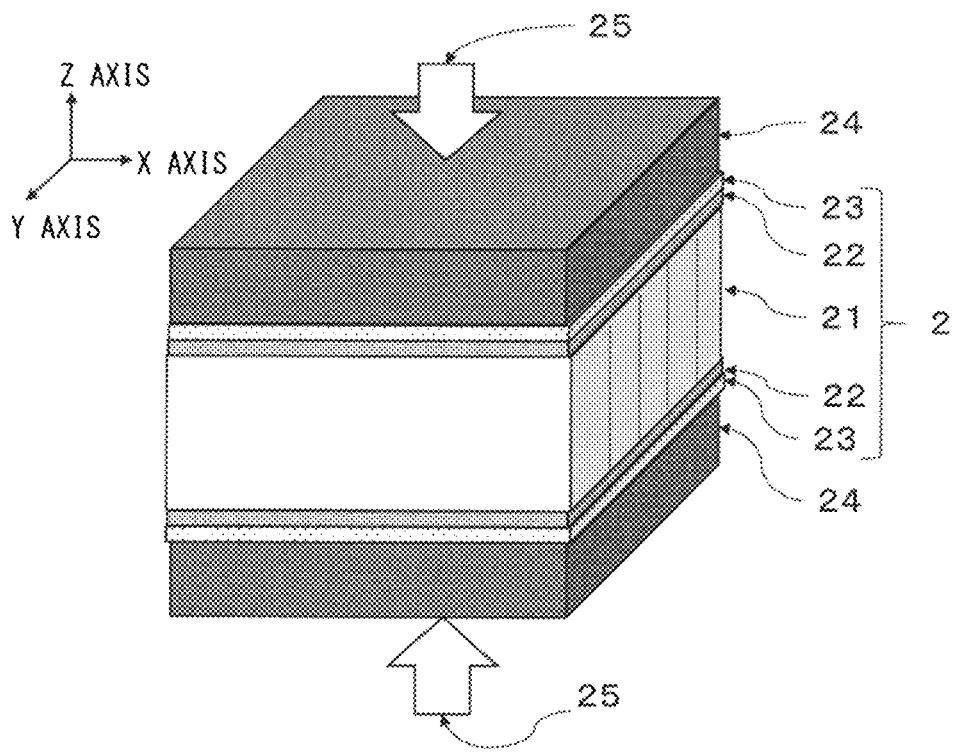
FIG. 2 is a perspective view of an anisotropic graphite composite.

The (A) anisotropic graphite composite in accordance with one or more embodiments includes the (a) anisotropic graphite, a (b) titanium-containing metal layer, and a (c) inorganic material layer. For example, as illustrated in FIG. 2, an (A) anisotropic graphite composite 2 in accordance with one or more embodiments includes the following layers, in the following order from top to bottom in a Z axis direction: a (c) inorganic material layer 23; a (b) titanium-containing metal layer 22; (a) anisotropic graphite 21; a (b) titanium-containing metal layer 22; and a (c) inorganic material layer 23.

(a) Anisotropic Graphite

The (a) anisotropic graphite included in the (A) anisotropic graphite composite in accordance with one or more embodiments can be the (a) anisotropic graphite described above in the section "1. (a) Anisotropic Graphite".

In the (A) anisotropic graphite composite in accordance with one or more embodiments, an interface of the (a) anisotropic graphite at which the (a) anisotropic graphite is joined to the (b) titanium-containing metal layer has an interface roughness of not less than 1 μm and not more than 15 μm, or not less than 2 μm not more than 10 μm, or not less than 2 μm and not more than 4 μm. A face of the (c) inorganic material layer which is joined to the (b) titanium-containing metal layer has a surface roughness of not less than 1 μm and not more than 15 μm, or not less than 2 μm and not more than 8 μm, or not less than 3 μm and not more than 5 μm.

(b) Titanium-Containing Metal Layer

In the (A) anisotropic graphite composite in accordance with one or more embodiments, providing a metal layer including titanium (which is an active metal) between the anisotropic graphite and the inorganic material layer results in a very high wettability between the metal layer and both of the (a) anisotropic graphite and (c) inorganic material layer. This facilitates favorable atom diffusion. This provides excellent long-term reliability to the resultant (A) anisotropic graphite composite.

In the (A) anisotropic graphite composite in accordance with one or more embodiments, the titanium content of the (b) titanium-containing metal layer may be not less than 0.1 weight % and not more than 2.0 weight %, or not less than 0.5 weight % and not more than 1.5 weight %. The titanium content of the (b) titanium-containing metal layer may be more than 1.5 weight %. Setting the titanium content of the (b) titanium-containing metal layer to be not more than 2.0 weight %, prevents the titanium content from affecting the long-term reliability of the (A) anisotropic graphite composite. Furthermore, because there is a low content of titanium, which has low thermal conductivity, it is possible to achieve favorable heat transmission performance in the resulting (A) anisotropic graphite composite. Setting the titanium content of the (b) titanium-containing metal layer to be not less than 0.1 weight %, provides increased wettability between the metal layer and the (a) anisotropic graphite and the (c) inorganic material layer, which facilitates atom diffusion. This makes it possible to achieve favorable long-term reliability in the resulting anisotropic graphite composite.

Components other than titanium in the (b) titanium-containing metal layer are not particularly limited. However, the (b) titanium-containing metal layer may contain silver and/or copper because these metals have high thermal conductivity and allow the resulting (A) anisotropic graphite composite to have excellent heat transmission performance.

The thickness of the (b) titanium-containing metal layer is not particularly limited but may be not less than 10 μm and not more than 60 μm, or not less than 20 μm and not more than 40 μm, to provide favorable heat transfer coefficient in the resulting (A) anisotropic graphite composite and to achieve favorable long-term reliability in the resulting (A) anisotropic graphite composite.

The (b) titanium-containing metal layer may be in the form of a plate or foil having a predetermined thickness. It is also possible to use a titanium-containing metal layer in the form of a slurry and/or a titanium-containing metal layer in the form of a powder, in combination with the titanium-containing metal layer in the form of a plate or foil.

(c) Inorganic Material Layer

Examples of the (c) inorganic material layer encompass a metal layer and a ceramic layer.

Metal Layer

The following description will discuss a metal layer that can serve as the (c) inorganic material layer. The metal from which the metal layer is formed is not particularly limited. Examples of metals for the metal layer encompass copper, aluminum, nickel, molybdenum, and tungsten. Copper is particularly preferable in terms of the heat transmission performance of the (A) anisotropic graphite composite. The metal layer may be formed from one metal, a plurality of metals, or a plated metal in which, e.g. gold and/or nickel is/are plated on the surface of e.g. copper.

Ceramic Layer

The following description will discuss a ceramic layer that can serve as the (c) inorganic material layer. The ceramic from which the ceramic layer is formed is not particularly limited. Examples of ceramic for the ceramic layer encompass alumina, zirconia, silicon carbide, silicon nitride, boron nitride, and aluminum nitride. Silicon carbide or aluminum nitride is particularly preferable in terms of the heat transmission performance of the (A) anisotropic graphite composite.

Surface Roughness of (c) Inorganic Material Layer

In the (A) anisotropic graphite composite in accordance with one or more embodiments, among faces that form the (c) inorganic material layer, an interface of the (c) inorganic material layer at which the (c) inorganic material layer is joined to the (b) titanium-containing metal layer has an interface roughness of not less than 1 μm and not more than 15 μm, or not less than 2 μm and not more than 8 μm, or not less than 3 μm and not more than 5 μm. In a case where the interface of (c) at which (c) is joined to (b) has an interface roughness of not more than 15 μm, when joining by heating is carried out, it is easy for atoms diffusion to progress at the joining surface between the (b) titanium-containing metal layer and the (c) inorganic material layer, and it is possible to achieve an excellent balance between heat transmission performance and long-term reliability in the resultant (A) anisotropic graphite composite.

Thickness of (c) Inorganic Material Layer

The thickness of the (c) inorganic material layer is not particularly limited but may be not less than 10 μm and not more than 1 mm, or not less than 50 μm and not more than 500 μm, or not less than 100 μm and not more than 300 μm. Setting the thickness of the (c) inorganic material layer to be not less than 10 μm provides the (c) inorganic material layer with sufficient strength and makes it possible to obtain an anisotropic graphite composite having favorable long-term reliability. Setting the thickness of the (c) inorganic material layer to be not more than 1 mm allows the (c) inorganic material layer to have low thermal resistance and makes it possible to obtain an anisotropic graphite composite having excellent heat transmission performance.

Method of Producing (A) Anisotropic Graphite Composite

The following description will discuss a method of producing the (A) anisotropic graphite composite in accordance with one or more embodiments.

A method of producing an anisotropic graphite composite in accordance with one or more embodiments includes: (i) a surface treatment step of roughening or polishing the surface of at least one face of (a) anisotropic graphite, the at least one face being selected from faces of the (a) anisotropic graphite which are perpendicular to crystal orientation planes of graphite layers in the (a) anisotropic graphite, the crystal orientation planes being parallel to an X-Z plane, given an X axis, a Y axis orthogonal to the X axis, and a Z axis perpendicular to an X-Y plane; and (ii) a joining step of stacking the (a) anisotropic graphite, a (b) titanium-containing metal layer, and a (c) inorganic material layer in this order in a Z axis direction and joining the (a) anisotropic graphite, the (b) titanium-containing metal layer, and the (c) inorganic material layer to each other.

As described above, the (A) anisotropic graphite composite in accordance with one or more embodiments includes the (a) anisotropic graphite, the (b) titanium-containing metal layer, and the (c) inorganic material layer.

FIG. 2 illustrates an example of the production method thereof.

The method of producing the (A) anisotropic graphite composite in accordance with one or more embodiments includes a surface treatment step of roughening or polishing the surface of at least one face of the (a) anisotropic graphite, the at least one face being selected from faces of the (a) anisotropic graphite which are perpendicular to the crystal orientation planes of graphite layers in the (a) anisotropic graphite, the crystal orientation planes being parallel to the X-Z plane.

The method of producing the (A) anisotropic graphite composite in accordance with one or more embodiments may include a surface treatment step of roughening or polishing the surfaces of two faces (e.g., two opposite faces, the face 11 and the face opposite thereof in FIG. 1, or the face 13 and the face opposite thereof in FIG. 1) of the (a) anisotropic graphite, the two faces being selected from faces of the (a) anisotropic graphite which are perpendicular to the crystal orientation planes of graphite layers in the (a) anisotropic graphite, the crystal orientation planes being parallel to the X-Z plane.

The surface treatment step can be used to adjust the surface roughness of a face to a desired surface roughness (for example, not less than 1 μm and not more than 15 μm, or not less than 2 μm and not more than 10 μm, or not less than 3 μm and not more than 5 μm).

A specific method used for the surface treatment step is not particularly limited. In a case where the surface of a face is to be roughened, the surface roughness of the face can be adjusted by for example, blast treatment, hairline treatment, or satin finishing. In a case where the surface of a face is to be polished, the surface roughness of the face can be adjusted by, for example, buffing, lapping, or rotary grinding.

The shape of the (a) anisotropic graphite subjected to the surface treatment step is not particularly limited. The (a) anisotropic graphite may have a length in a direction parallel to the X axis of not less than 4 mm and not more than 300 mm, or not less than 10 mm and not more than 100 mm. The (a) anisotropic graphite may have a length in a direction parallel to the Y axis of not less than 4 mm and not more than 300 mm, or not less than 10 mm and not more than 100 mm. The length of the anisotropic graphite in the direction parallel to the X axis and the length of the anisotropic graphite in the direction parallel to the Y axis may be (i) the same, (ii) such that the former is greater than the latter, or (iii) such that the latter is greater than the former. The (a) anisotropic graphite may have a thickness in a Z axis direction of not less than 0.5 mm and not more than 5.0 mm, or not less than 1.0 mm and not more than 3.5 mm, or not less than 1.2 mm and not more than 2.5 mm. In the surface treatment step, the (a) anisotropic graphite may be cut or ground so as to have the above-described shape.

In a method of producing the (A) anisotropic graphite composite in accordance with one or more embodiments, given an X axis, a Y axis orthogonal to the X axis, and Z axis perpendicular to a X-Y plane, a stack is formed by providing the following members/layers in the following order from top to bottom along the Z axis direction: a holding member 24; a (c) inorganic material layer 23; a (b) titanium-containing metal layer 22; (a) anisotropic graphite 21; a (b) titanium-containing metal layer 22; a (c) inorganic material layer 23; and a holding member 24. A load is applied so as to apply pressure to the stack in directions 25. While the pressure is being applied, the stack is heated (for example, for 30 minutes to 1 hour at a temperature range of 700° C. to 1000° C.) in a vacuum (for example, $10^{-3}$ Pa) and then cooled to normal temperature, so as to obtain the (A) anisotropic graphite composite 2.

Pressure

The above pressure is not particularly limited, provided that the (a) anisotropic graphite, the (b) titanium-containing metal layers, and the (c) inorganic material layers are joined to each other.

In the method of producing the (A) anisotropic graphite composite in accordance with one or more embodiments, the joining step may involve applying pressure to the stack with a load of 50 kg/m² to 500 kg/m², or may involve applying pressure to the stack with a load of 100 kg/m² to 300 kg/m². Setting the load to be not less than 50 kg/m² makes it easy for atom diffusion to progress at a joining surface between the (a) anisotropic graphite and the (b) titanium-containing metal layer and a joining surface between the (b) titanium-containing metal layer and the (c) inorganic material layer. This makes it possible to achieve excellent long-term reliability in the resultant (A) anisotropic graphite composite. Setting the load to be not more than 500 kg/m² prevents brazing material from wetting and spreading to the (c) inorganic material layer which is not in contact with the (b) titanium-containing metal layer. This prevents poor contact between the heat source and the anisotropic graphite composite.

Heating

In the method of producing the (A) anisotropic graphite composite in accordance with one or more embodiments, in the joining step, the heating can be carried out in a vacuum, an inert gas such as nitrogen and/or argon, a reducing gas such as hydrogen, or a mixed gas containing an inert gas and a reducing gas. In terms of the long-term reliability of the resultant (A) anisotropic graphite composite, the heating may be carried out in a vacuum or in a reducing gas, or may be carried out in a vacuum.

In addition to applying the load as above, carrying out heating at 700° C. to 1000° C. (for example at not less than 780° C. and not more than 830° C., or at not less than 790° C. and not more than 820° C.) as described above causes atom diffusion at each of: parts where the highly reactive (b) titanium-containing metal layer is joined to the (a) anisotropic graphite; and parts where the highly reactive (b) titanium-containing metal layer is joined to the (c) inorganic material layer. This causes the titanium in the (b) titanium-containing metal layer to from a titanium compound with the (a) anisotropic graphite and the (c) inorganic material layer. As such, the (a) anisotropic graphite, the (b) titanium-containing metal layer, and the (c) inorganic material layer form a strong structure as if they were a single substance. This provides excellent heat transmission performance and long-term reliability to the resultant (A) anisotropic graphite composite.

The anisotropic graphite composite that is obtained can be, for example, cut or ground into a predetermined shape with use of known techniques. The anisotropic graphite composite may be plated.

Some embodiments may be configured as follows.

[1]

Anisotropic graphite including:

graphite layers whose respective crystal orientation planes are parallel to an X-Z plane, given an X axis, a Y axis orthogonal to the X axis, and a Z axis perpendicular to an X-Y plane, the anisotropic graphite having a length in a direction parallel to the X axis of not less than 4 mm and not more than 300 mm, the anisotropic graphite having a length in a direction parallel to the Y axis of not less than 4 mm and not more than 300 mm, the anisotropic graphite having a thickness in a Z axis direction of not less than 0.5 mm and not more than 5.0 mm, and out of faces of the anisotropic graphite which are parallel to the X-Y plane, at least one face having a surface roughness of not less than 1 µm and not more than 15 µm.

[2]

The anisotropic graphite according to [1], in which out of faces of the anisotropic graphite which are parallel to the X-Y plane, at least one face has a surface roughness of not less than 2 µm and not more than 10 µm.

[3]

The anisotropic graphite according to [1], in which two faces of the anisotropic graphite that are parallel to the X-Y plane have a surface roughness of not less than 2 µm and not more than 10 µm.

[4]

An anisotropic graphite composite including: (a) anisotropic graphite; a (b) titanium-containing metal layer; and a (c) inorganic material layer, the (a) anisotropic graphite having graphite layers whose respective crystal orientation planes are parallel to an X-Z plane, given an X axis, a Y axis orthogonal to the X axis, and a Z axis perpendicular to an X-Y plane, the (a) anisotropic graphite having a length in a direction parallel to the X axis of not less than 4 mm and not more than 300 mm, the (a) anisotropic graphite having a length in a direction parallel to the Y axis of not less than 4 mm and not more than 300 mm, the (a) anisotropic graphite having a thickness in a Z axis direction of not less than 0.5 mm and not more than 5.0 mm, the (a) anisotropic graphite, the (b) titanium-containing metal layer, and the (c) inorganic material layer being stacked in this order in the Z axis direction and joined to each other, an interface of the (a) anisotropic graphite, at which the (a) anisotropic graphite is joined to the (b) titanium-containing metal layer, having an interface roughness of not less than 1 pm and not more than 15 μm, an interface of the (c) inorganic material layer, at which the (c) inorganic material layer is joined to the (b) titanium-containing metal layer, having an interface roughness of not less than 1 μm and not more than 15 μm.

[5]

The anisotropic graphite composite according to [4], in which the interface of the (a) anisotropic graphite at which the (a) anisotropic graphite is joined to the (b) titanium-containing metal layer has an interface roughness of not less than 2 μm and not more than 4 μm.

[6]

The anisotropic graphite composite according to [4] or [5], in which the (b) titanium-containing metal layer has a thickness of not less than 20 μm and not more than 40 μm.

[7]

The anisotropic graphite composite according to any one of [4] to [6], in which the (b) titanium-containing metal layer has a titanium content of not less than 0.1 weight % and not more than 2.0 weight %.

[8]

The anisotropic graphite composite according to any one of [4] to [7], in which an interface of the (c) inorganic material layer at which the (c) inorganic material layer is joined to the (b) titanium-containing metal layer has an interface roughness of not less than 2 μm and not more than 8 μm.

[9]

A method of producing an anisotropic graphite composite, including:

(i) a surface treatment step of roughening or polishing the surface of at least one face of (a) anisotropic graphite, the at least one face being selected from faces of the (a) anisotropic graphite which are perpendicular to crystal orientation planes of graphite layers in the (a) anisotropic graphite, the crystal orientation planes being parallel to an X-Z plane, given an X axis, a Y axis orthogonal to the X axis, and a Z axis perpendicular to an X-Y plane; and (ii) a joining step of stacking the (a) anisotropic graphite, a (b) titanium-containing metal layer, and a (c) inorganic material layer in this order in a Z axis direction and joining the (a) anisotropic graphite, the (b) titanium-containing metal layer, and the (c) inorganic material layer to each other.

[10]

The method according to [9], in which the joining step is carried out at a temperature of not less than 780° C. and not more than 830° C. in a vacuum, an inert gas, a reducing gas, or a mixed gas containing an inert gas and a reducing gas, while applying pressure with a load of 50 kg/m² to 500 kg/m² to a stack in which the (a) anisotropic graphite, the (b) titanium-containing metal layer, and the (c) inorganic material layer are stacked in this order.

Some embodiments may be configured as follows.

<1>

Anisotropic graphite including:

graphite layers whose respective crystal orientation planes are parallel to an X-Z plane, given an X axis, a Y axis orthogonal to the X axis, and a Z axis perpendicular to an X-Y plane, the anisotropic graphite having a length in a direction parallel to the X axis of not less than 4 mm and not more than 300 mm, the anisotropic graphite having a length in a direction parallel to the Y axis of not less than 4 mm and not more than 300 mm, the anisotropic graphite having a thickness in a Z axis direction of not less than 0.5 mm and not more than 5.0 mm, and out of faces of the anisotropic graphite which are parallel to the X-Y plane, at least one face having a surface roughness of not less than 1 μm and not more than 15 μm.

<2>

The anisotropic graphite according to <1>, in which the anisotropic graphite has a surface roughness of not less than 2 pm and not more than 10 μm.

<3>

The anisotropic graphite according to <1>, in which two faces that are parallel to the X-Y plane of the graphite layers have a surface roughness of not less than 2 μm and not more than 10 μm.

<4>

An anisotropic graphite composite including: (a) anisotropic graphite; a (b) titanium-containing metal layer; and a (c) inorganic material layer, the (a) anisotropic graphite having graphite layers whose respective crystal orientation planes are parallel to an X-Z plane, given an X axis, a Y axis orthogonal to the X axis, and a Z axis perpendicular to an X-Y plane, the anisotropic graphite having a length in a direction parallel to the X axis of not less than 4 mm and not more than 300 mm, the anisotropic graphite having a length in a direction parallel to the Y axis of not less than 4 mm and not more than 300 mm, the anisotropic graphite having a thickness in a Z axis direction of not less than 0.5 mm and not more than 5.0 mm, and (a), (b), and (c), being stacked in this order in the Z axis direction and joined to each other, a face of (a) at which (a) is joined to (b) having a surface roughness of not less than 1 μm and not more than 15 μm, a face of (c) at which (c) is joined to (b) having a surface roughness of not less than 1 μm and not more than 15 μm.

<5>

The anisotropic graphite composite according to <4>, in which the face of (a) at which (a) is joined to (b) has a surface roughness of not less than 2 μm and not more than 10 μm.

<6>

The anisotropic graphite composite according to <4> or <5>, in which the (b) titanium-containing metal layer has a thickness of not less than 20 μm and not more than 40 μm.

<7>

The anisotropic graphite composite according to any one of <4> to <6>, wherein the (b) titanium-containing metal layer has a titanium content of not less than 0.1 weight % and not more than 2.0 weight %.

<8>

The anisotropic graphite composite according any one of <4> to <7>, in which an interface of (c) at which (c) is joined to (b) has a surface roughness of not less than 2 μm and not more than 8 μm.

<9>

A method of producing an anisotropic graphite composite, including:

(i) a surface treatment step of roughening or polishing the surface of at least one cross section of anisotropic graphite, the at least one cross section being selected from faces of the anisotropic graphite which are cross sections perpendicular to crystal orientation planes of graphite layers in the anisotropic graphite; and (ii) a joining step of stacking (a) anisotropic graphite, a (b) titanium-containing metal layer, and (c) inorganic material layer in this order in a Z axis direction and joining (a), (b), and (c) to each other, given an X axis, a Y axis orthogonal to the X axis, and a Z axis perpendicular to an X-Y plane.
<10>
The method according to <9>, in which the joining step is carried out at a temperature of not less than 780° C. and not more than 830° C. in a vacuum, an inert gas, a reducing gas, or a mixed gas containing an inert gas and a reducing gas, while applying pressure with a load of 50 kg/m² to 500 kg/m².

EXAMPLES

The following description will discuss the anisotropic graphite composite and a production method thereof in accordance with one or more embodiments, with reference to Examples and Comparative Examples. Note, however, that the one or more embodiments according to this disclosure are not limited to these examples.

Surface Roughness Measurement Method

Surface roughness of the (a) anisotropic graphite and the (c) inorganic material layer was measured using the "Portable Surface Roughness Tester" manufactured by Mitutoyo Corp. (model no.: SJ-310). The unit used was pm, and measurements were carried out 5 times each, with precision being one-tenth of a pm. The results of the five measurements were then averaged, and a value obtained by rounding the average to the nearest tenth of a μm was considered to be the measured surface roughness (unit: μm).

Thickness Measurement Method

The thickness of the (b) titanium-containing metal layer was measured using a micrometer manufactured by Mitutoyo Corp. (model no.: MDC-25SX). The unit used was μm, and measurements were carried out 5 times each, with the smallest unit being 1 μm. The results of the five measurements were then averaged, and a value obtained by rounding the average to the nearest tenth of a pm was considered to be the measured thickness T2 (unit: μm).

Measurement Method for Interface Roughness of Interface Between Anisotropic Graphite and Titanium-Containing Metal Layer in Anisotropic Graphite Composite The following method was used to measure the interface roughness of the interface between the anisotropic graphite and the titanium-containing metal layer in the anisotropic graphite composite. A benchtop specimen polisher manufactured by IMT Co., Ltd. (model no.: IM-P2) was used to buff the anisotropic graphite composite along a plane perpendicular to the crystal orientation planes of the graphite layers in the anisotropic graphite so as to obtain a cross section. Thereafter, a broad ion beam was used to polish the cross section. This cross section was then observed with a scanning electron microscope (5,000× magnification). The maximum interface roughness within the observed range was read at 1 μm units and considered to be the interface roughness (μm) of the interface between the anisotropic graphite and the titanium-containing metal layer.

Figure 4:
FIG. 4 is a scanning microscope image of an interface between anisotropic graphite and a titanium-containing metal layer in an anisotropic graphite composite.

FIG. 4 is a scanning electron microscope photograph of the interface between the anisotropic graphite and the titanium-containing metal layer in the anisotropic graphite composite of Example 1.

Measurement Method for Interface Roughness of Interface Between Titanium-Containing Metal Layer and Inorganic Material Layer in Anisotropic Graphite Composite The following method was used to measure the interface roughness of the interface between the titanium-containing metal layer and the inorganic material layer in the anisotropic graphite composite. A benchtop specimen polisher manufactured by IMT Co., Ltd. (model no.: IM-P2) was used to buff the anisotropic graphite composite along a plane perpendicular to the crystal orientation planes of the graphite layers in the anisotropic graphite so as to obtain a cross section. Thereafter, a broad ion beam was used to polish the cross section. This cross section was then observed with a scanning electron microscope (200× magnification). An average maximum interface roughness within the observed range was read at 1 μm units and considered to be the interface roughness (μm) of the interface between the titanium-containing metal layer and the inorganic material layer.

Heat Transmission Performance Evaluation Method

Figure 3:
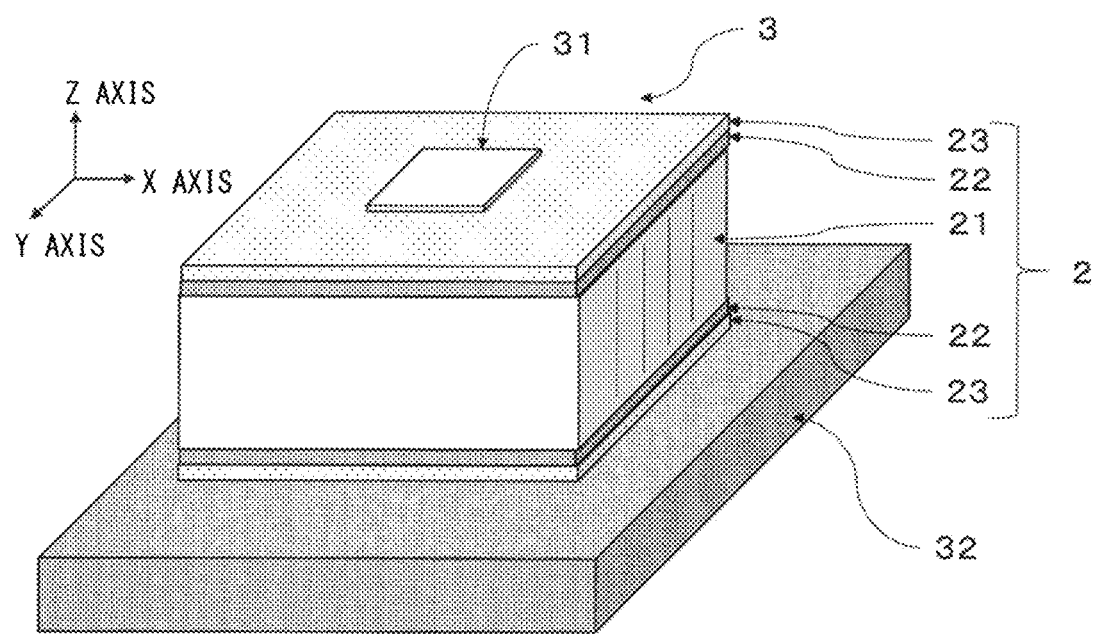
FIG. 3 is a perspective view of a structure for evaluating an anisotropic graphite composite.

FIG. 3 is a perspective view of a structure used for evaluating the heat transmission performance of the anisotropic graphite composite. The following are stacked, from top to bottom in the Z axis direction: a ceramic heater 31; the anisotropic graphite composite 2; and a water-cooled heat sink 32. Stacked in the anisotropic graphite composite 2 are: an inorganic material layer 23, a titanium-containing metal layer 22, anisotropic graphite 21, a titanium-containing metal layer 22, and an inorganic material layer 23.

The anisotropic graphite composite 2 had a size of 20 mm×20 mm and a thickness of 5 mm. To a center part of the upper face of the anisotropic graphite composite 2 was affixed the ceramic heater 31 (micro ceramic heater; manufactured by Sakaguchi E.H VOC Corp.; model no. MS-M5; 5 mm×5 mm) to which silicon grease manufactured by Shin-Etsu Silicone (product no.: G775) had been applied. To a lower face of the anisotropic graphite composite 2 was applied silicon grease manufactured by Shin-Etsu Silicone (product no.: G775), and then the water-cooled heat sink 32 (heat sink manufactured by Pepaless Co., Ltd.; model no.: TR-WHS7V1) was affixed thereto. Water having a temperature of 18° C. was circulated in the water-cooled heat sink 32, and quantity of heat of 10 W was applied to the ceramic heater 31. In this state, a thermal image of the ceramic heater 31 and the upper face of the anisotropic graphite composite 2 was captured using an infrared camera manufactured by Nippon Avionics Co., Ltd. (model no.: InfRec R300SR). This thermal image was analyzed to measure a maximum temperature K1 of the ceramic heater 31 and a minimum temperature K2 of the upper face of the anisotropic graphite composite 2. A temperature difference (K1−K2) was calculated from K1 and K2.

The heat transmission performance was evaluated as follows.

A: The temperature difference (K1−K2) between K1 and K2 is not more than 5° C.

B: The temperature difference (K1−K2) between K1 and K2 is more than 5° C. but not more than 10° C.

C: The temperature difference (K1−K2) between K1 and K2 is more than 10° C.

In the case of A and B, it was determined that heat spreads uniformly through the anisotropic graphite composite 2 and that heat transmission performance was excellent.

Long-Term Reliability Evaluation Method

The anisotropic graphite composite 2 was placed in a heat shock tester manufactured by ESPEC Corp. (model no.: TSA-43EL). Heat shock testing was then carried out a temperature range of −40° C. to 150° C., with a steady state time of 5 minutes at both −40° C. and 150° C. The number of cycles was 500.

The maximum temperature of the ceramic heater 31 prior to the heat shock testing was considered to be $K1_0$, and the maximum temperature of the ceramic heater 31 after the heat shock testing was considered to be $K1_1$. A temperature change ($K1_1-K1_0$) of not more than 3° C. was evaluated as "A". A temperature change ($K1_1-K1_0$) of more than 3° C. but not more than 5° C. was evaluated as "B". A temperature change ($K1_1-K1_0$) of more than 5° C. was evaluated as "C". In the case of A and B, it was considered that the heat transmission performance had not deteriorated and that long-term reliability was excellent.

Production Example 1

Preparation of Graphite Block

A production example of a graphite block was as follows.
A polyimide film stack was made by stacking 1,500 polyimide films (manufactured by Kaneka Corporation) each of which had a size of 100 mm×100 mm and a thickness of 25 μm. Thereafter, while applying pressure to the stack via pressing with a force of 40 kg/cm², the stack was heated to 2900° C. in a heat treatment in an inert gas atmosphere, such that a graphite block was produced (size: 90 mm×90 mm; thickness: 15 mm). The graphite block had a thermal conductivity of 1500 W/mK in the direction of the crystal orientation planes of the graphite layers, and 5 W/mK in a direction perpendicular to the crystal orientation planes.

Production Example 2-1

Preparation of Anisotropic Graphite (a1)

Given an X axis, a Y axis orthogonal to the X axis, and a Z axis perpendicular to a plane including the X and Y axes, the graphite block prepared in Production Example 1 (size: 90 mm×90 mm; thickness: 15 mm) was arranged such that the crystal orientation planes of the graphite were parallel to the X-Z plane. A wire saw was then used to cut the graphite block to a size of 20 mm×20 mm in the X-Y plane and a thickness of 4.5 mm in the Z axis direction. In this way, anisotropic graphite (a1) was obtained in which the face 11 (which is parallel to the X-Y plane), the face 13 (which is parallel to the Y-Z plane), and the faces opposite the face 11 and face 13 each had a surface roughness of 50 μm.

Production Example 2-2

Preparation of Anisotropic Graphite (a2)

Out of faces of the anisotropic graphite, the face 11 (which is parallel to the X-Y plane) and a face opposite thereto as illustrated in FIG. 1 were polished with a file (grit: #8000) so as to each have a surface roughness of 5 μm. Anisotropic graphite (a2) was thus obtained.

Production Example 2-3

(Preparation of Anisotropic Graphite (a3)

Out of faces of the anisotropic graphite, the face 11 (which is parallel to the X-Y plane) and a face opposite thereto as illustrated in FIG. 1 were polished with a file (grit: #2000) so as to each have a surface roughness of 12 μm. Anisotropic graphite (a3) was thus obtained.

Production Example 2-4

(Preparation of Anisotropic Graphite (a4)

Out of faces of the anisotropic graphite, the face 11 (which is parallel to the X-Y plane) and a face opposite thereto as illustrated in FIG. 1 were polished with a file (grit: #1000) so as to each have a surface roughness of 15 μm. Anisotropic graphite (a4) was thus obtained.

Production Example 2-5

(Preparation of Anisotropic Graphite (a5)

Out of faces of the anisotropic graphite, the face 11 (which is parallel to the X-Y plane) and a face opposite thereto as illustrated in FIG. 1 were polished with a file (grit: #600) so as to each have a surface roughness of 30 μm. Anisotropic graphite (a5) was thus obtained.

(a1) Anisotropic graphite: the face 11, the face 13, and the faces opposite of the face 11 and the face 13 each have a surface roughness of 50 μm.
(a2) Anisotropic graphite: the face 11 and the face opposite thereto each have a surface roughness of 5 μm.
(a3) Anisotropic graphite: the face 11 and the face opposite thereto each have a surface roughness of 12 μm.
(a4) Anisotropic graphite: the face 11 and the face opposite thereto each have a surface roughness of 15 μm.
(a5) Anisotropic graphite: the face 11 and the face opposite thereto each have a surface roughness of 30 μm.

Production Example 3

Preparation of (b) Titanium-Containing Metal Layer

Used as the (b) titanium-containing metal layer were the following (b 1) through (b4).
(b1): Titanium-containing silver solder (titanium content: 1.0 weight %; thickness: 30 μm; 20 mm×20 mm)
(b2): Titanium-containing silver solder (titanium content: 1.0 weight %; thickness: 50 μm; 20 mm×20 mm)
(b3): Titanium-containing silver solder (titanium content: 1.5 weight %; thickness: 30 μm; 20 mm×20 mm)
(b4): Silver solder (titanium content: 0 weight %; thickness: 30 μm; 20 mm×20 mm)

Production Example 4

Method of Producing (c) Inorganic Material Layer

As the (c) inorganic material layer, the following pure copper (c1) through (c3) were obtained by using files of #1000 grit to #8000 grit to polish the surface of one side of pure copper having a size of 20 mm×20 mm and a thickness of 200 μm.
(c1): Pure copper; 20 mm×20 mm; thickness: 200 μm; surface roughness on one side: 3 μm
(c2): Pure copper; 20 mm×20 mm; thickness: 200 μm; surface roughness on one side: 10 μm
(c3): Pure copper; 20 mm×20 mm; thickness: 200 μm; surface roughness on one side: 20 μm
(d) Holding Member
(d1): An isotropic graphite block manufactured by Toyo Tanso Co., Ltd. (product number: TTK-9) was used.

Example 1

As illustrated in FIG. 2, the following were stacked in the Z axis direction, from top to bottom: (d1) as a holding member 24; (c1) as an inorganic material layer 23; (b1) as a titanium-containing metal layer 22; (a2) as anisotropic graphite 21; (b1) as a titanium-containing metal layer 22; (c1) as an inorganic material layer 23; and (d1) as a holding member 24. A load of 100 kg/m² was applied to the stack from above and below in the Z axis direction (i.e., from load application directions 25). In this state, the stack was heated for 30 minutes in a vacuum of $10^{-3}$ Pa and at a temperature of 810° C. and then cooled to normal temperature. In this way, an (A1) anisotropic graphite composite 2 was obtained.

(a2) Anisotropic graphite: the face 11 and the face opposite thereto each have a surface roughness of 5 μm.

(b1): Titanium-containing silver solder; titanium content: 1.0%; thickness: 30 μm (c1): Pure copper; surface roughness on one side: 3 μm (d1): An isotropic graphite block manufactured by Toyo Tanso Co., Ltd. (product number: TTK-9)

A structure made of the ceramic heater 31, the (A1) anisotropic graphite composite 2, and the water-cooled heat sink 32 was prepared as illustrated in FIG. 3, and the heat transmission performance and the long-term reliability of the (A) anisotropic graphite composite were evaluated.

Figure 5:
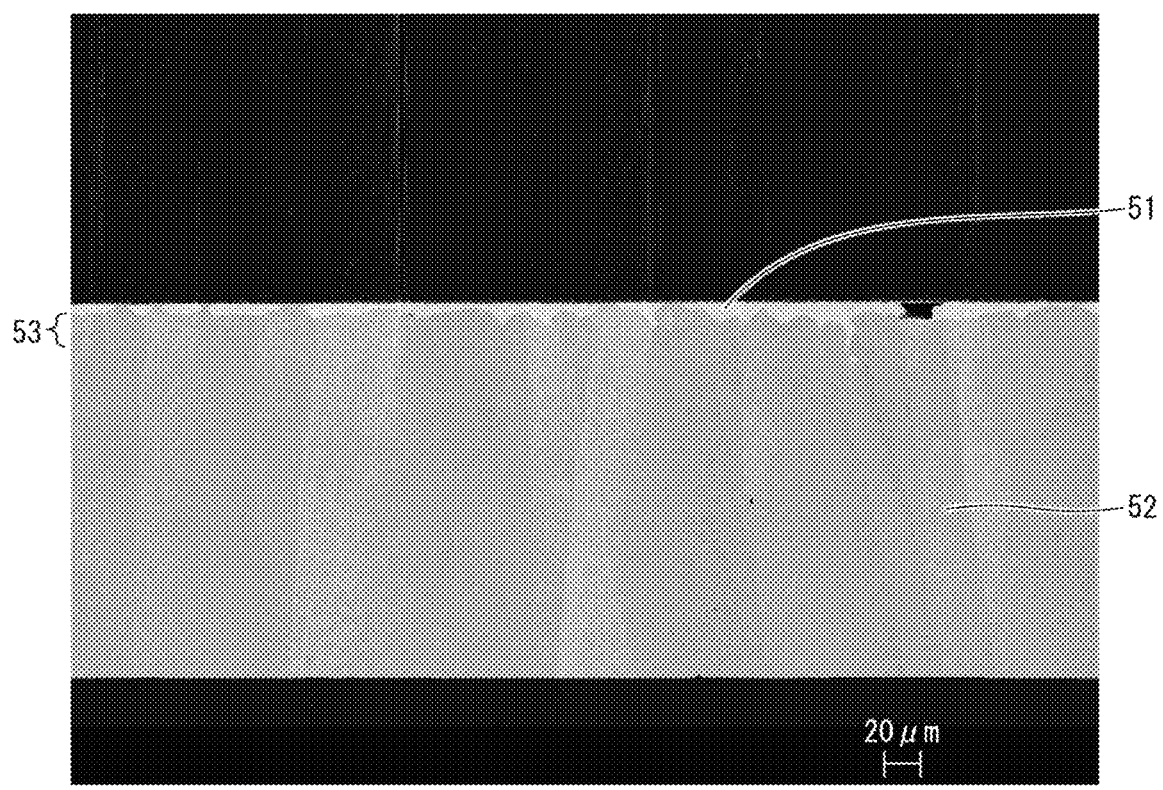
FIG. 5 is a scanning microscope image of an interface between a titanium-containing metal layer and an inorganic material layer in an anisotropic graphite composite.

In the anisotropic graphite composite 42 in accordance with Example 1, an interface between anisotropic graphite 42 and a titanium-containing metal layer 41 (i.e., interface portions 43 between the anisotropic graphite and the titanium-containing metal layers) had an interface roughness of 2 μm, as illustrated in FIG. 4. Furthermore, in the anisotropic graphite composite in accordance with Example 1, the interface between a titanium-containing metal layer 51 and an inorganic material layer 52 (i.e., interface portions 53 between the titanium-containing metal layers and the inorganic material layers) had an interface roughness of 3 μm, as illustrated in FIG. 5.

Example 2

An (A2) anisotropic graphite composite was obtained by a method similar to that of Example 1, except that (a3) was used instead of (a2). The heat transmission performance and the long-term reliability of the (A2) anisotropic graphite composite were evaluated. The interfaces between anisotropic graphite and titanium-containing metal layers of the anisotropic graphite composite had an interface roughness of 5 μm. The interfaces between titanium-containing metal layers and inorganic material layers of the anisotropic graphite composite had an interface roughness of 3 μm.

Example 3

An (A3) anisotropic graphite composite was obtained by a method similar to that of Example 1, except that (c2) was used instead of (c1). The heat transmission performance and the long-term reliability of the (A3) anisotropic graphite composite were evaluated. The interfaces between anisotropic graphite and titanium-containing metal layers of the anisotropic graphite composite had an interface roughness of 2 μm. The interfaces between titanium-containing metal layers and inorganic material layers of the anisotropic graphite composite had an interface roughness of 10 μm.

Example 4

An (A4) anisotropic graphite composite was obtained by a method similar to that of Example 1, except that (b2) was used instead of (b1). The heat transmission performance and the long-term reliability of the (A4) anisotropic graphite composite were evaluated. The interfaces between anisotropic graphite and titanium-containing metal layers of the anisotropic graphite composite had an interface roughness of 2 μm. The interfaces between titanium-containing metal layers and inorganic material layers of the anisotropic graphite composite had an interface roughness of 3 μm.

Example 5

An (A5) anisotropic graphite composite was obtained by a method similar to that of Example 1, except that (b3) was used instead of (b1). The heat transmission performance and the long-term reliability of the (A5) anisotropic graphite composite were evaluated. The interfaces between anisotropic graphite and titanium-containing metal layers of the anisotropic graphite composite had an interface roughness of 2 μm. The interfaces between titanium-containing metal layers and inorganic material layers of the anisotropic graphite composite had an interface roughness of 3 μm.

Example 6

An (A6) anisotropic graphite composite was obtained by a method similar to that of Example 1, except that (a4) was used instead of (a2), and (b2) was used instead of (b1). The heat transmission performance and the long-term reliability of the (A6) anisotropic graphite composite were evaluated. The interfaces between anisotropic graphite and titanium-containing metal layers of the anisotropic graphite composite had an interface roughness of 7 μm. The interfaces between titanium-containing metal layers and inorganic material layers of the anisotropic graphite composite had an interface roughness of 10 μm.

Comparative Example 1

An (A7) anisotropic graphite composite was obtained by a method similar to that of Example 1, except that (a5) was used instead of (a2). The heat transmission performance and the long-term reliability of the (A7) anisotropic graphite composite were evaluated. The interfaces between anisotropic graphite and titanium-containing metal layers of the anisotropic graphite composite had an interface roughness of 20 μm. The interfaces between titanium-containing metal layers and inorganic material layers of the anisotropic graphite composite had an interface roughness of 3 μm.

Comparative Example 2

An (A8) anisotropic graphite composite was obtained by a method similar to that of Example 1, except that (a4) was used instead of (a2), (b2) was used instead of (b1), and (c3) was used instead of (c1). The heat transmission performance and the long-term reliability of the (A8) anisotropic graphite composite were evaluated. The interfaces between anisotropic graphite and titanium-containing metal layers of the anisotropic graphite composite had an interface roughness of 7 μm. The interfaces between titanium-containing metal layers and inorganic material layers of the anisotropic graphite composite had an interface roughness of 20 μm.

Comparative Example 3

An (A9) anisotropic graphite composite was obtained by a method similar to that of Example 1, except that (b4) was used instead of (b1). The heat transmission performance and the long-term reliability of the (A9) anisotropic graphite composite were evaluated. The interfaces between anisotropic graphite and titanium-containing metal layers of the anisotropic graphite composite had an interface roughness of 2 μm. The interfaces between titanium-containing metal layers and inorganic material layers of the anisotropic graphite composite had an interface roughness of 3 μm.

The following table shows the measured values and evaluations of heat transmission performance (K1–K2) and long-term reliability ($K1_1$–$K1_0$) of the anisotropic graphite composites (A1) through (A9) as evaluated in the Examples and the Comparative Examples.

12: Face parallel to X-Z plane
13: Face parallel to Y-Z plane
14: One of crystal orientation planes of graphite layers
2: Anisotropic graphite composite
21: Anisotropic graphite
22: Titanium-containing metal layer
23: Inorganic material layer

TABLE 1

| | Component parts of (A) graphite complex | | | | | |
|---|---|---|---|---|---|---|
| | (a) Anisotropic graphite | | (b) Titanium-containing metal layer | | | (c) Inorganic material layer | |
| | Production Example | Surface roughness (μm) | Production Example | Thickness (μm) | Ti content (weight %) | Production Example | Surface roughness (μm) |
| Example 1 | a2 | 5 | b1 | 30 | 1.0 | c1 | 3 |
| Example 2 | a3 | 12 | b1 | 30 | 1.0 | c1 | 3 |
| Example 3 | a2 | 5 | b1 | 30 | 1.0 | c2 | 10 |
| Example 4 | a2 | 5 | b2 | 50 | 1.0 | c1 | 3 |
| Example 5 | a2 | 5 | b3 | 30 | 1.5 | c1 | 3 |
| Example 6 | a4 | 15 | b2 | 50 | 1.0 | c2 | 10 |
| Comp Ex. 1 | a5 | 30 | b1 | 30 | 1.0 | c1 | 3 |
| Comp. Ex. 2 | a4 | 15 | b2 | 50 | 1.0 | c3 | 20 |
| Comp. Ex. 3 | a2 | 5 | b4 | 30 | 0 | c1 | 3 |

| | (A) Graphite complex | | | Evaluation | | | |
|---|---|---|---|---|---|---|---|
| | | Interface roughness of interface between (a) and (b) (μm) | Interface roughness of interface between (b) and (c) (μm) | Heat transmission performance | | Long-term reliability | |
| | Production Example | | | K1-K2 (°C.) | Evaluation | $K1_1$-$K1_0$ (°C.) | Evaluation |
| Example 1 | A1 | 2 | 3 | 3.0 | A | 2.0 | A |
| Example 2 | A2 | 5 | 3 | 3.5 | A | 4.0 | B |
| Example 3 | A3 | 2 | 10 | 3.5 | A | 4.0 | B |
| Example 4 | A4 | 2 | 3 | 7.0 | B | 2.0 | A |
| Example 5 | A5 | 2 | 3 | 3.0 | A | 2.0 | A |
| Example 6 | A6 | 7 | 10 | 7.0 | B | 2.0 | A |
| Comp. Ex. 1 | A7 | 20 | 3 | 8.0 | B | 8.0 | C |
| Comp. Ex. 2 | A8 | 7 | 20 | 12.0 | C | 6.0 | C |
| Comp. Ex. 3 | A9 | 2 | 3 | — | — | — | — |

Note:
In Table 1, "Comp. Ex." is an abbreviation for "Comparative Example".

As indicated in Table 1, it can be seen from the Examples 1 to 6 and the Comparative Examples 1 to 3 that an anisotropic graphite composite (A) including (a) anisotropic graphite, a (b) titanium-containing metal layer, and a (c) inorganic material layer has excellent heat transmission performance and long-term reliability in a case where the interface of (a) at which (a) is joined to (b) has an interface roughness of not less than 1 pm and not more than 15 μm, and the interface of (c) at which (c) is joined to (b) has an interface roughness of not less than 1 pm and not more than 15 μm.

According to some embodiments, anisotropic graphite having excellent heat transmission performance and long-term reliability may be obtained. As such, the anisotropic graphite in accordance with one or more embodiments and an anisotropic graphite composite in accordance with one or more embodiments can be suitably applied in, for example, electronic equipment and electronic parts.

REFERENCE SIGNS LIST

1: Anisotropic graphite
11: Face parallel to X-Y plane

24: Holding member
25: Load application direction
3: Structure
31: Ceramic heater
32: Water-cooled heat sink
41: Titanium-containing metal layer
42: Anisotropic graphite
43: Interface portion between anisotropic graphite and titanium-containing metal layer
51: Titanium-containing metal layer
52: Inorganic material layer
53: Interface portion between titanium-containing metal layer and inorganic material layer

The invention claimed is:
1. An anisotropic graphite composite comprising:
(a) anisotropic graphite;
(b) a titanium-containing metal layer; and
(c) an inorganic material layer,
the (a) anisotropic graphite having graphite layers whose respective crystal orientation planes are parallel to an X-Z plane, given an X axis, a Y axis orthogonal to the X axis, and a Z axis perpendicular to an X-Y plane, the anisotropic graphite (a) having a length in a direction parallel to the X axis of not less than 4 mm and not more than 300 mm, the anisotropic graphite (a) having a length in a direction parallel to the Y axis of not less than 4 mm and not more than 300 mm, the anisotropic graphite (a) having a thickness in a Z axis direction of not less than 0.5 mm and not more than 5.0 mm, the anisotropic graphite (a), the titanium-containing metal layer (b), and the inorganic material layer (c) being stacked in this order in the Z axis direction and joined to each other, an interface of the anisotropic graphite (a), at which the anisotropic graphite (a) is joined to the titanium-containing metal layer (b), having an interface roughness of not less than 2 μm and not more than 7 μm, an interface of the inorganic material layer (c), at which the inorganic material layer (c) is joined to the titanium-containing metal layer (b), having an interface roughness of not less than 3 μm and not more than 10 μm.

2. The anisotropic graphite composite according to claim 1, wherein the interface of the anisotropic graphite (a) at which the anisotropic graphite (a) is joined to the titanium-containing metal layer (b) has an interface roughness of not less than 2 μm and not more than 4 μm.

3. The anisotropic graphite composite according to claim 1, wherein the titanium-containing metal layer (b) has a thickness of not less than 20 μm and not more than 40 μm.

4. The anisotropic graphite composite according to claim 1, wherein the titanium-containing metal layer (b) has a titanium content of not less than 0.1 weight % and not more than 2.0 weight %.

5. The anisotropic graphite composite according to claim 1, wherein an interface of the inorganic material layer (c) at which the inorganic material layer (c) is joined to the titanium-containing metal layer (b) has an interface roughness of not less than 2 μm and not more than 8 μm.

6. The anisotropic graphite composite according to claim 1, wherein the interface of the inorganic material layer (c), at which the inorganic material layer (c) is joined to the titanium-containing metal layer (b), has an interface roughness of not less than 3 μm and not more than 5 μm.

* * * * *